(12) United States Patent
Forman et al.

(10) Patent No.: US 7,596,431 B1
(45) Date of Patent: Sep. 29, 2009

(54) METHOD FOR ASSESSING ELECTRONIC DEVICES

(75) Inventors: George Forman, Port Orchard, WA (US); Cullen Bash, Los Gatos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 442 days.

(21) Appl. No.: 11/590,525

(22) Filed: Oct. 31, 2006

(51) Int. Cl.
*G05D 23/00* (2006.01)
*G05B 19/18* (2006.01)
*G05B 11/01* (2006.01)
*G05B 13/02* (2006.01)
*G06F 11/30* (2006.01)
*G06F 15/173* (2006.01)

(52) U.S. Cl. .............................. 700/299; 700/9; 700/11; 700/19; 700/29; 700/276; 702/182; 709/226

(58) Field of Classification Search .................. 700/2, 700/9, 11, 12, 19, 22, 28–31, 49, 50, 275–278, 700/291, 295, 299, 300; 702/132, 182–184, 702/188; 709/223–226; 713/323, 324, 330; 361/687, 688, 695
See application file for complete search history.

(56) References Cited

U.S. PATENT DOCUMENTS

| | | | |
|---|---|---|---|
| 6,574,104 B2 | 6/2003 | Patel et al. | |
| 6,859,882 B2 * | 2/2005 | Fung | 713/300 |
| 2003/0193777 A1 * | 10/2003 | Friedrich et al. | 361/687 |
| 2005/0228618 A1 * | 10/2005 | Patel et al. | 702/188 |
| 2006/0075764 A1 | 4/2006 | Bash et al. | |
| 2008/0004837 A1 * | 1/2008 | Zwinger et al. | 702/182 |

* cited by examiner

*Primary Examiner*—Sean P Shechtman

(57) ABSTRACT

In a method for assessing a plurality of electronic devices, cooling efficiencies for the plurality of electronic devices are calculated, where the cooling efficiencies comprise measures of energy usage requirements to respectively maintain the plurality of electronic devices within predetermined temperature ranges. In addition, the plurality of electronic devices are ranked according to their cooling efficiencies and the plurality of electronic devices are stored according to their rankings.

20 Claims, 9 Drawing Sheets

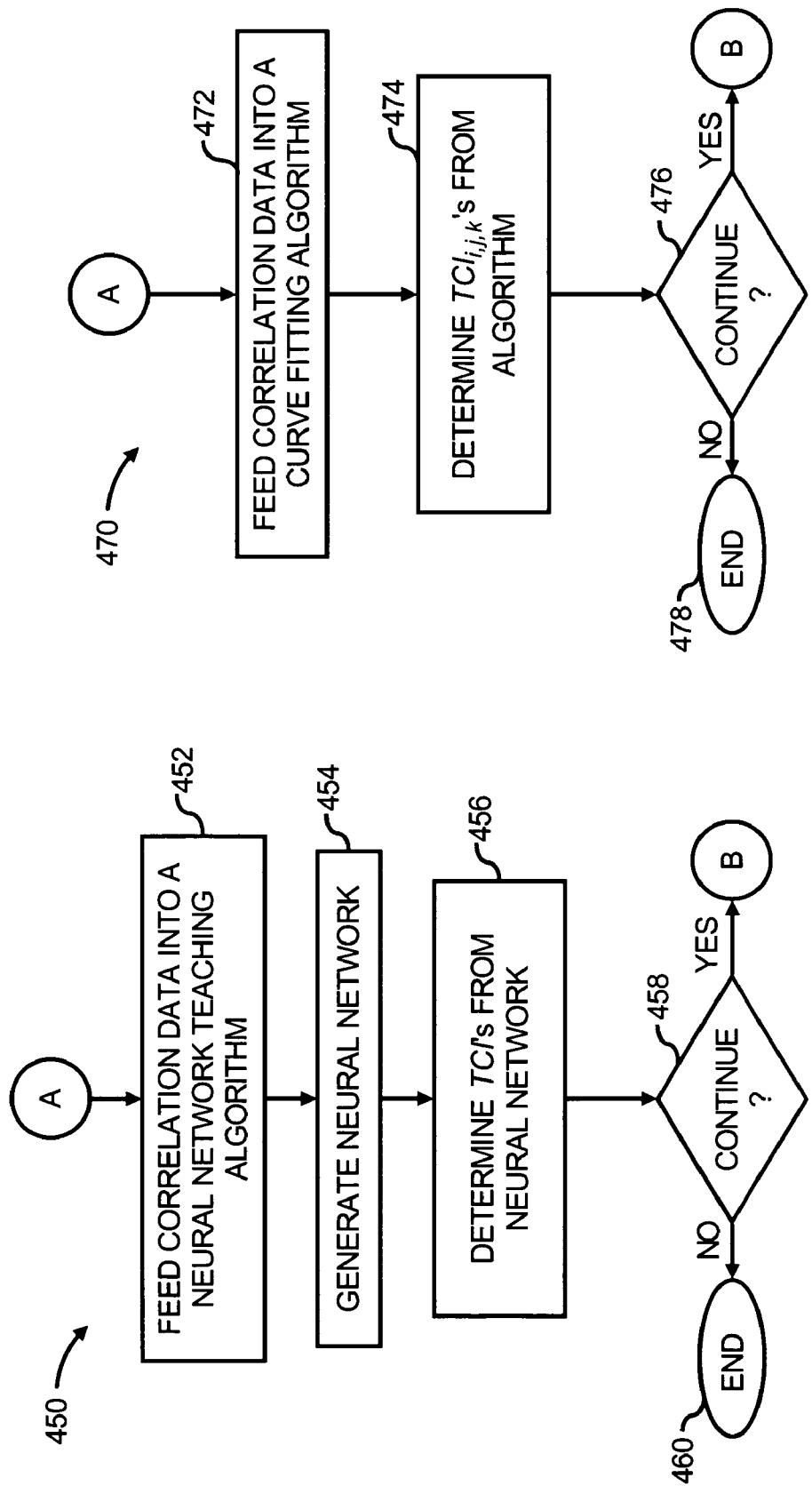

METHOD FOR ASSESSING ELECTRONIC DEVICES

BACKGROUND

A data center may be defined as a location, for instance, a room that houses computer systems arranged in a number of racks. These racks are configured to house a number of computer systems which typically include a number of printed circuit boards (PCBs), mass storage devices, power supplies, processors, micro-controllers, and semi-conductor devices, that dissipate relatively significant amounts of heat during their operation.

Air conditioning units are typically used to cool heated air and to supply the cooled air to the computer systems. The cooled air is typically supplied through a series of vent tiles positioned above a plenum that directs airflow from the air conditioning units to the vent tiles. Conventional cooling systems are typically provisioned and operated for worst-case or peak load scenarios. Since it is estimated that typical data center operations only utilize a fraction of their computer systems, provisioning for these types of scenarios often increases the inefficiencies found in conventional cooling systems.

In addition, workloads are typically placed onto the computer systems in the racks in either a random manner or based upon a scheme that follows the availability of the computer systems. As such, conventional systems typically place the workload on a plurality of computer systems and then either decrease or increase the air conditioning unit operations depending upon changes in the temperatures of the airflow supplied back into the air conditioning units. Again, operating air conditioning units in this manner is inefficient because the air conditioning units typically consume greater amounts of energy than is necessary to adequately cool the computer systems.

BRIEF DESCRIPTION OF THE DRAWINGS

Features of the present invention will become apparent to those skilled in the art from the following description with reference to the figures, in which:

FIG. 4B illustrates a flow diagram of an method for commissioning sensors through use of a neural network, according to an embodiment of the invention;

FIG. 4C illustrates a flow diagram of an method for commissioning sensors through use of a curve fitting algorithm, according to an embodiment of the invention;

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a method and system for assessing electronic devices, such as servers, computer systems, storage devices, etc. The electronic devices are assessed to determine their respective cooling efficiencies, which may be defined as measures of the energy usage requirements to respectively maintain the electronic devices within predetermined temperature ranges. As disclosed herein, the cooling efficiencies are based upon a number of factors, including a thermal correlation index between fluid moving devices and sensors to which the electronic devices are associated. In addition, in certain examples, the cooling efficiencies are weighted based upon various operational characteristics of the fluid moving devices to, for instance, provide a relatively more balanced workload distribution.

The electronic devices may be associated with respective sensors based upon, for instance, the locations of the electronic devices with respect to the sensors. In addition, the thermal correlation indexes of the sensors, and the electronic devices by association, may be determined through a commissioning process, as also disclosed herein.

According to an example, the electronic devices are ranked according to their respective cooling efficiencies and the ranking is stored in a database. According to another example, the cooling efficiencies are employed in selecting the most energy efficient workload placement arrangement. In other words, workloads may be placed on the electronic devices having the highest cooling efficiencies since those electronic devices have been identified as requiring the least amount of energy to maintain within predetermined temperature ranges.

Figure 1A:
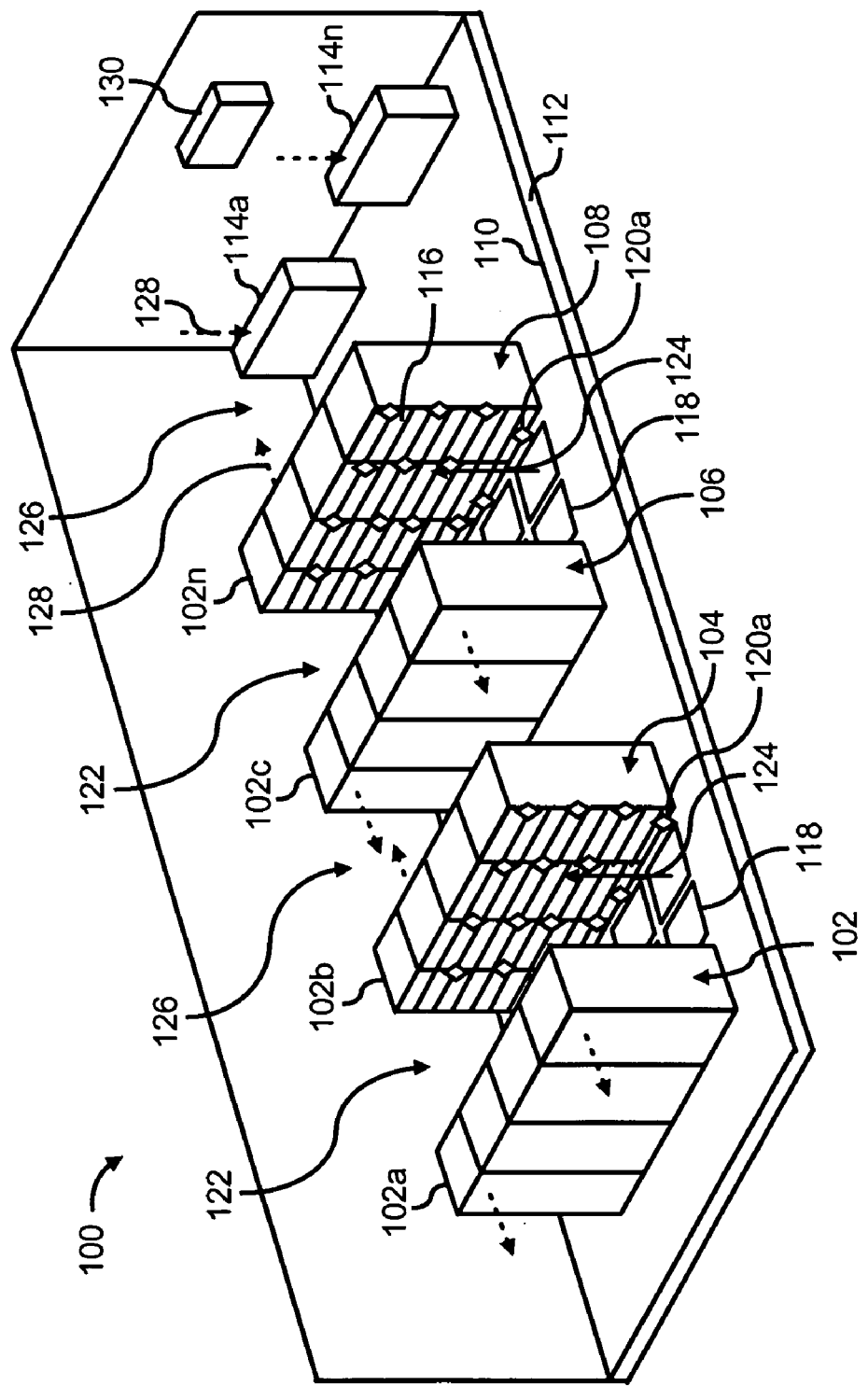
FIG. 1A shows a simplified perspective view of a data center which may employ various examples of a system for assessing a plurality of electronic devices in the data center, according to an embodiment of the invention.

With reference first to FIG. 1A, there is shown a simplified perspective view of a section of a data center 100, which may employ various examples of a system for assessing a plurality of electronic devices in the data center 100 disclosed herein. The terms "data center" are generally meant to denote a room or other space where one or more components capable of generating heat may be situated. In this respect, the terms "data center" are not meant to limit embodiments of the invention to any specific type of room where data is communicated or processed, nor should it be construed that use of the terms "data center" limits the invention in any respect other than its definition herein above.

The data center 100 is depicted as having a plurality of racks 102a-102n, where "n" is an integer greater than one. The racks 102a-102n are generally configured to house electronic devices 116 capable of generating/dissipating heat, for instance, computers, servers, bladed servers, disk drives, displays, etc. The electronic devices 116 may be operated to perform various electronic functions, for instance, computing, switching, routing, displaying, and the like.

The racks 102a-102n are depicted as being positioned on a raised floor 110, which may function as a plenum for delivery of cooled fluid, such as, air, refrigerant, water, a water and glycol mixture, etc., from one or more fluid moving devices 114a-114n. As shown in FIG. 1A, when the fluid comprises a gas, such as air or a gaseous refrigerant, the fluid is delivered through vents 118 to the racks 102a-102n. In other instances, when the fluid comprises a liquid, such as water, a liquid refrigerant, a multi-state refrigerant, etc., the fluid may be delivered to the racks 102a-102n through a series of pipes (not shown).

The fluid moving devices 114a-114n, where "n" is an integer greater than one, generally operate to supply fluid flow to a space 112 beneath the raised floor 110, and in certain instances to cool heated fluid (indicated by the arrows 128). In addition, the fluid moving devices 114a-114n generally operate to supply the electronic devices 116 housed in the racks 102a-102n with fluid flow that has been cooled, through any reasonably suitable known manners and may thus comprise widely available, conventional air conditioning (AC) units. For instance, the fluid moving devices 114a-114n may comprise vapor-compression type air conditioning units, chiller type air conditioning units, etc. Examples of suitable fluid moving devices 114a-114n may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

The fluid moving devices 114a-114n include respective actuators (not shown) configured to manipulate characteristics of the cooled fluid flow supplied to the racks 102a-102n, such as fluid flow temperature and supply rate. As such, the actuators include, for instance, devices for manipulating fluid flow temperature, such as chillers, heat exchangers, etc., and devices for manipulating the supply flow rates, such as variable frequency devices, blowers, etc., of the cooled fluid.

The cooled fluid, indicated by the arrows 124, is delivered from the space 112 to the racks 102a-102n through fluid delivery devices 118 located between some or all of the racks 102a-102n. The fluid delivery devices 118 may comprise, for instance, ventilation tiles, variable fluid flow volume devices, etc., and are shown as being located between rows 104a and 104b and 104c and 104d. Although the fluid delivery devices 118 and the space 112 have been depicted as being located on a floor of the data center 100, it should be understood that the fluid delivery devices 118 and the space 112 may be positioned on the ceiling or a wall of the data center 100 without departing from a scope of the invention.

In any regard, the cooled fluid contained in the space 112 may include cooled fluid supplied by one or more fluid moving devices 114a-114n, and in certain instances, fluid flow recirculated into the space 112. Thus, characteristics of the cooled fluid, such as, temperature, pressure, humidity, flow rate, etc., may substantially be affected by the operations of a plurality of the fluid moving devices 114a-114n. In this regard, characteristics of the cooled fluid at various areas in the space 112 and the cooled fluid supplied to the racks 102a-102n may vary, for instance, due to mixing of the cooled fluid. In other words, the characteristics of the cooled fluid supplied to a particular location in the data center 100 may differ from that of the cooled fluid supplied by a single fluid moving device 114a. In addition, the characteristics of the cooled fluid supplied through the fluid delivery devices 118 are affected by the characteristics of fluid flowing through the other fluid delivery devices 118.

Also shown in FIG. 1A are a plurality of sensors 120a-120n, where "n" is an integer greater than one, configured to detect temperature at their respective locations. The sensors 120a-120n are represented as diamonds to distinguish them from other elements depicted in FIG. 1A. In addition, the sensors 120a-120n are depicted as being positioned to detect the temperatures at various locations near the inlets of the racks 102a-102n. Although not shown, the sensors 120a-120n may comprise sensors associated with or integrally manufactured with one or more of the electronic devices 116. Alternatively, however, the sensors 120a-120n may comprise separately installed sensors 120a-120n.

In any regard, the sensors 120a-120n may be networked with a controller 130, discussed herein below. As described below, the controller 130 may employ the conditions detected by the sensors 120a-120n at various fluid moving device 114a-114n settings to determine the level of influence each of the fluid moving devices 114a-114n has over areas near each of the sensors 120a-120n. The detected conditions may include, for instance, temperature, pressure, fluid flow volume, humidity, etc. In addition, by determining which of the electronic devices1 16 is located near which of the sensors 120a-120n, the controller 130 may also determine the level of influence each of the fluid moving devices 114a-114n has over each of the electronic devices 116.

In one example, the sensors 120a-120n may be assigned to the families of one or more fluid moving devices 114a-114n. A fluid moving device 114a-114n "family" may be defined as a grouping of sensors 120a-120n that respond to the various fluid moving device 114a-114n settings to levels greater than a predefined threshold level. In other words, a sensor 120a may be considered as being in the fluid moving device 114a family if the response of the sensor 120a exceeds a predefined threshold level at various fluid moving device 114a settings. Various manners in which the sensors 120a-120n, and thus, the electronic devices 116 may be assigned to one or more fluid moving device 114a-114n families is described in greater detail herein below.

In addition, various manners in which the fluid moving devices 114a-114n may be operated are described in greater detail in co-pending and commonly assigned U.S. patent application Ser. No. 11/474,765, filed on Jun. 26, 2006, and entitled "Method for Thermally Managing a Room," the disclosure of which is hereby incorporated by reference in its entirety.

The fluid moving devices 114a-114n may be controlled by a controller 130, which may be configured to perform various functions in the data center 100. Some of the functions of the controller 130 are described in greater detail herein below. Although the controller 130 is illustrated in FIG. 1A as comprising a component separate from the electronic devices 116 housed in the racks 102a-102n, the controller 130 may comprise one or more of the electronic devices 116 or an electronic device outside of the data center 100 without departing from a scope of the data center 100 disclosed herein. As another example, various functions of the controller 130 discussed herein may be performed by one or more of the fluid moving devices 114a-114n. In addition, or alternatively, the controller 130 may comprise software configured to operate on a computing device, for instance, one of the electronic devices 116 or one of the fluid moving devices 114a-114n.

In any regard, the controller 130 may generally assess costs associated with placing workload onto the electronic devices 116, such as, applications, calculations, or other computer-implemented operations. The costs may comprise costs associated with operating the fluid moving devices 114a-114n predicted to arise from placing the workload on the electronic devices 116 given a current cooling profile and available cooling resources. In other words, the controller 130 may assess the cooling efficiencies of the electronic devices 116 to determine how efficient or inefficient it is to cool the electronic devices 116. As discussed in greater detail herein below, in one example, the controller 130 ranks the electronic devices 116 according to their respective cooling efficiencies and populates a database with the rankings. In another example, the controller 130 utilizes the rankings to select one or more of the electronic devices 116 to perform the workload to thereby substantially maximize the efficiencies of the fluid moving devices 114a-114n in cooling the electronic devices 116.

Figure 1B:
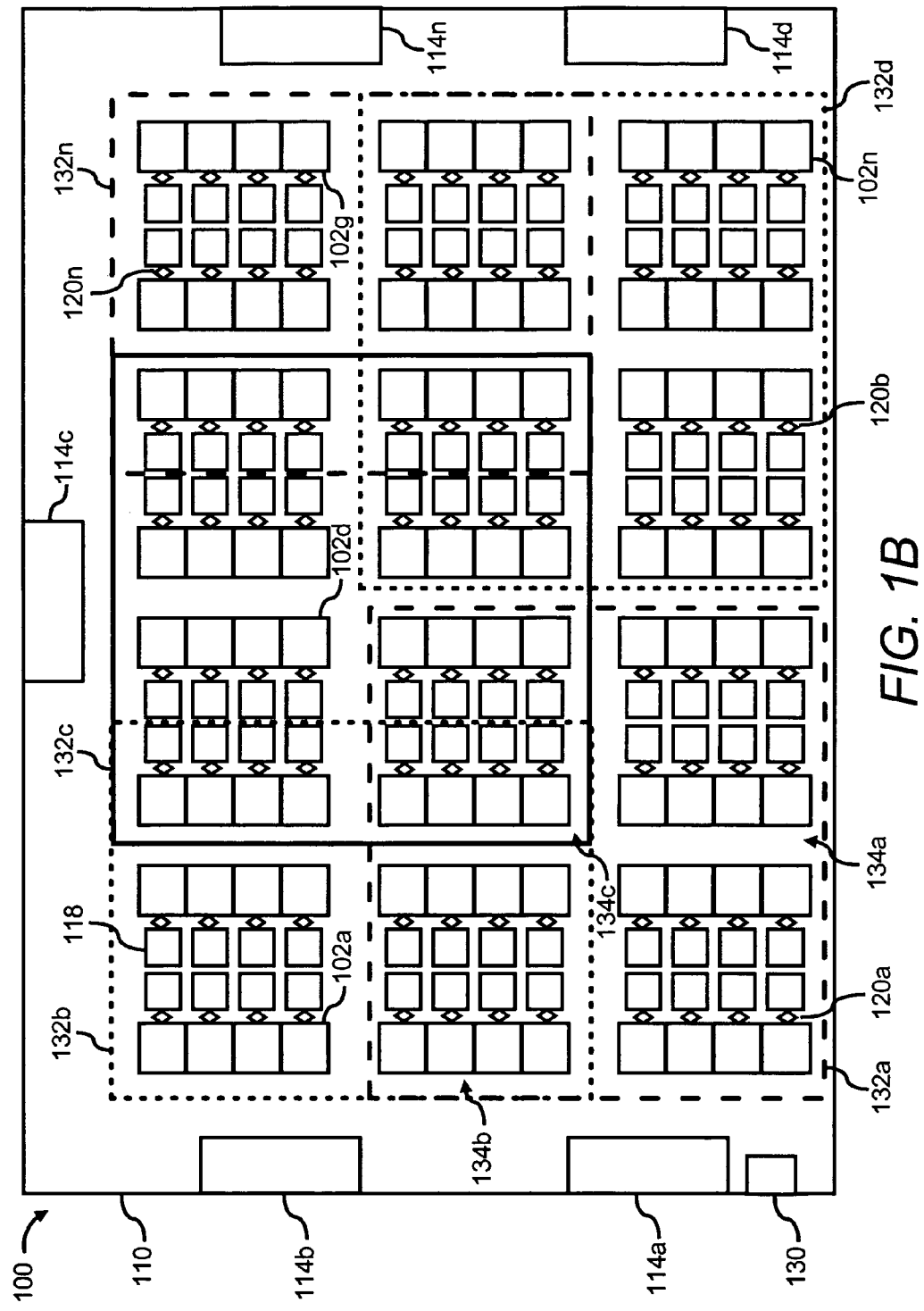
FIG. 1B is a simplified plan view of the data center depicted in FIG. 1A.

With reference now to FIG. 1B, there is shown a simplified plan view of the data center 100 depicted in FIG. 1A. The data center 100 is shown as including fluid moving devices 114a-114n positioned at various locations throughout the data center 100. A plurality of fluid delivery devices 118 are also illustrated in FIG. 1B and are configured to deliver cooled fluid flow to racks 102a-102n as described above. It should be appreciated that the data center 100 may include any reasonably suitable number of racks 102a-102n, fluid moving devices 114a-114n, and fluid delivery devices 118 without departing from the data center 100 illustrated in FIG. 1B.

As shown in FIG. 1B, the sensors 120a-120n may be grouped into one or more fluid moving device 114a-114n families 132a-132n based upon various criteria, as described in greater detail herein below. The various fluid moving device 114a-114n families 132a-132n are illustrated in FIG. 1B. As shown, the sensors 120a-120n are considered as being within the families 132a-132n of those fluid moving devices 114a-114n.

Some of the sensors 120a-120n, for instance, the sensors 120a-120n in a first section 134a may be included in the family 132a of a single fluid moving device 114a. Some of the other sensors 120a-120n, for instance, the sensors 120a-120n in a second section 134b may be included in the families 132a and 132b of two fluid moving devices 114a and 114b. In addition, some of the sensors 120a-120n, for instance, the sensors 120a-120n in a third section 134c may be included in the families 132a-132c of three fluid moving devices 114a-114c. As such, for instance, one or more of the sensors 120a-120n may belong to more than one fluid moving device 114a-114n family.

It should, in any regard, be understood that the fluid moving device families 132a-132n depicted in FIG. 1B are for purposes of illustration and are not intended to limit the data center 100 and its components in any respect. In addition, the grouping of the sensors 120a-120n is considered optional because the controller 130 may assess the electronic devices 116 without requiring that the sensors 120a-120n be grouped into the fluid moving device 114a-114n families 132a-132n.

Figure 2:
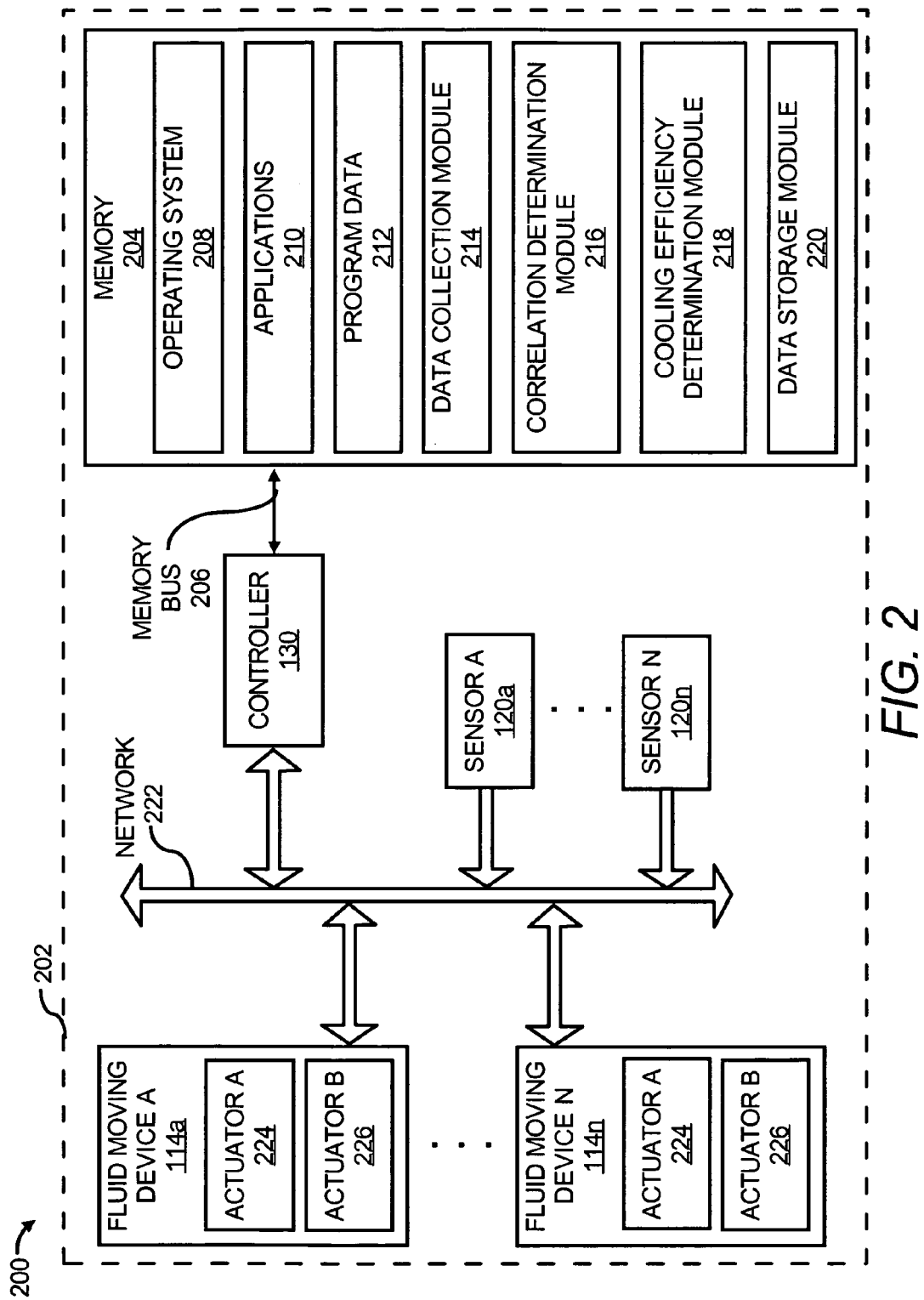
FIG. 2 is a block diagram of a system for assessing a plurality of electronic devices, according to an embodiment of the invention.

FIG. 2 is a block diagram 200 of a system 202 for assessing a plurality of electronic devices 116, according to an example. It should be understood that the following description of the block diagram 200 is but one manner of a variety of different manners in which such a system 202 may be configured. In addition, it should be understood that the system 202 may include additional components and that some of the components described herein may be removed and/or modified without departing from the scope of the system 202. For instance, the system 202 may include any number of sensors, memories, processors, fluid moving devices, etc., as well as other components, which may be implemented in the operations of the system 202.

As shown, the system 202 includes the controller 130 depicted in FIGS. 1A and 1B. As described hereinabove, the controller 130 is configured to perform various functions in the data center 100. In this regard, the controller 130 may comprise a computing device, for instance, a computer system, a server, etc. In addition, the controller 130 may comprise a microprocessor, a micro-controller, an application specific integrated circuit (ASIC), and the like, configured to perform various processing functions. In addition, or alternatively, the controller 130 may comprise software operating in any of a number of computing devices.

The controller 130 is illustrated as being in communication with a memory 204 through, for instance, a memory bus 206. However, in various instances, the memory 204 may form part of the controller 130 without departing from a scope of the system 202. Generally speaking, the memory 204 may be configured to provide storage of software, algorithms, and the like, that provide the functionality of the controller 130. By way of example, the memory 204 may store an operating system 208, application programs 210, program data 212, and the like. In this regard, the memory 204 may be implemented as a combination of volatile and non-volatile memory, such as DRAM, EEPROM, MRAM, flash memory, and the like. In addition, or alternatively, the memory 204 may comprise a device configured to read from and write to a removable media, such as, a floppy disk, a CD-ROM, a DVD-ROM, or other optical or magnetic media.

The memory 204 is also depicted as including a data collection module 214, a correlation determination module 216, a correlation determination module 216, a cooling efficiency determination module 218, and a data storage module 220. The controller 130 may invoke or otherwise implement the modules 214-220 to generally assess the electronic devices 116. The controller 130 may assess the electronic devices 116 to, for instance, determine the relative cooling efficiencies of the electronic devices 116 in performing workloads.

In addition to the definition provided above, the cooling efficiencies of the electronic devices 116 may be defined as the relative abilities of the fluid moving devices 114a-114n to maintain the electronic devices 116 within desired temperature ranges. The abilities of the fluid moving devices 114a-114n to maintain the electronic devices 116 within the desired temperature ranges may vary based upon a number of considerations. These considerations may include, for instance, for each of the electronic devices 116, one or more of a thermal management margin, a fluid moving device margin, a thermal correlation index, and a recirculation level.

The cooling efficiencies of the electronic devices 116 may therefore also be construed as the costs associated with maintaining the electronic devices 116 within the predetermined temperature range. Thus, those electronic devices 116 requiring lower costs are considered as having higher cooling efficiencies as compared with those electronic devices 116 requiring higher costs. In this regard, therefore, the cooling efficiencies may also respectively be construed as measures of the energy usage requirements to maintain each of the electronic devices 116 within a predetermined temperature range. The predetermined temperature range may include, for instance, safe, energy-efficient, recommended, etc., temperature operating ranges for the electronic devices 116.

In determining the respective cooling efficiencies, the controller 130 may initially invoke the data collection module 214 to collect data from the fluid moving devices 114a-114n and the sensors 120a-120n. In addition, the controller 130 may invoke the correlation determination module 216 to correlate the sensors 120a-120n with the fluid moving devices 114a-114n. In addition, the controller 130 may optionally implement the correlation determination module 216 to determine the fluid moving device 114a-114n families 132a-132n to which the sensors 120a-120n are assigned.

The controller 130 may also invoke the cooling efficiency determination module 218 to calculate the cooling efficiencies of the electronic devices 116 based upon the information collected by the data collection module 214 and the correlations determined by the correlation determination module 216.

The controller 130 may further implement the data storage module 220 to store the data collected by the data collection module 214. For instance, the data storage module 216 may store the data in a data storage location in the memory 204. In addition, the controller 130 may implement the data storage module 220 to store the correlations between the sensors 120a-120n and the fluid moving devices 114a-114n. Also stored in the data storage module 220 are correlations between the sensors 120a-120n and the electronic devices 116. More particularly, for instance, the electronic devices 116 are correlated to the locations of the sensors 120a-120n to thereby track which temperature measurements correspond to which of the electronic devices 116.

The data storage module 220 may store the sensor 120a-120n to fluid moving device 114a-114n and sensor 120a-120n to electronic device 116 correlation information in a variety of different manners. For instance, the data storage module 220 may store the information in the form of a look-up table. In addition, or alternatively, the data storage module 220 may store the information in the form of a map that may be employed to visualize the positions of the sensors 120a-120n and the electronic devices 116.

The controller 130 may further implement the data storage module 220 to store the cooling efficiencies of the electronic devices 116. Again, the controller 130 may store the cooling efficiency information in the form of a look-up table or graphically. In addition, the controller 130 may rank the electronic devices 116 according to their respective cooling efficiencies and may store the ranking in the data storage module 220. In one regard, therefore, the controller 130 may be configured to create a database containing the cooling efficiencies of the electronic devices 116 and their rankings with respect to each other. In addition, and as described below, the controller 130 may employ the cooling efficiency rankings to determine which of the plurality of electronic devices 116 are to be assigned various workloads.

Instructions from the controller 130 may be transmitted over a network 222 that operates to couple the various components of the system 202. Although not shown, the controller 130 may be equipped with or have access to software and/or hardware to enable the controller 130 to transmit and receive data over the network 222. The network 222 generally represents a wired or wireless structure in the data center 100 for the transmission of data between the various components of the system 202. The network 222 may comprise an existing network infrastructure or it may comprise a separate network configuration installed for the purpose of assessing the electronic devices 116 by the controller 130.

According to an example, the sensors 120a-120n are configured to transmit collected data over the network 222 for storage and processing. As stated above, the sensors 120a-120n comprise sensors configured to detect one or more conditions at various locations in the data center 100.

According to an example where the controller 130 is configured to control operations of the fluid moving devices 114a-114n, the controller 130 may transmit instructions over the network 222 to the fluid moving devices 114a-114n to vary operations of the fluid moving devices 114a-114n. As shown, the fluid moving devices 114a-114n each includes an actuator A 224 and an actuator B 226. The actuators 224 and 226 generally comprise devices for controlling different aspects of the fluid flow supplied by the fluid moving devices 114a-114n, which are also actuators. More particularly, the fluid moving devices 114a-114n may be considered as primary actuators and the actuators 224 and 226 may be considered as secondary actuators.

By way of example, the actuators 224 may comprise fluid flow volume varying devices, such as, variable frequency drives (VFDs), fans, blowers, etc. Generally speaking, VFDs comprise actuators configured to vary the speeds at which the fans or blowers operate to thereby control the fluid flow volume supplied by the fluid moving devices 114a-114n. In addition, the actuators 226 may comprise fluid flow temperature varying devices, such as, water-chillers, compressors, valves, etc. Alternatively, the actuators 226 may comprise humidity varying devices, such as, humidifiers and dehumidifiers. As described in greater detail herein below, the controller 130 may control the actuators 224 and 226 of the fluid moving devices 114a-114n to vary one or more characteristics of the fluid flow detected by the sensors 120a-120n. The conditions detected by the sensors 120a-120n at the various fluid moving device 114a-114n settings may be employed to commission the sensors 120a-120n with respect to the fluid moving devices 114a-114n.

In this regard, the fluid moving devices 114a-114n may also include respective interfaces (not shown) that generally enable data transfer between the fluid moving devices 114a-114n and the controller 130 over the network 222. The interfaces may comprise any reasonably suitable hardware and/or software capable to enabling the data transfer over the network 222.

According to another example, however, the controller 130 may not have direct control over the fluid moving devices 114a-114n, such as, in instances where the fluid moving devices 114a-114n are configured to operate in substantially independent manners with respect to each other. In these instances, for example, the fluid moving devices 114a-114n may be configured to vary their operations according to the temperature of fluid flow returning into the fluid moving devices 114a-114n, the temperature of the fluid at one or more locations in the data center 100, etc. Thus, for instance, these fluid moving devices 114a-114n may reduce the temperature of the fluid flow supplied if the detected fluid temperature is above a predetermined level. In other words, the fluid moving devices 114a-114n according to this example are locally controlled.

Figure 3:
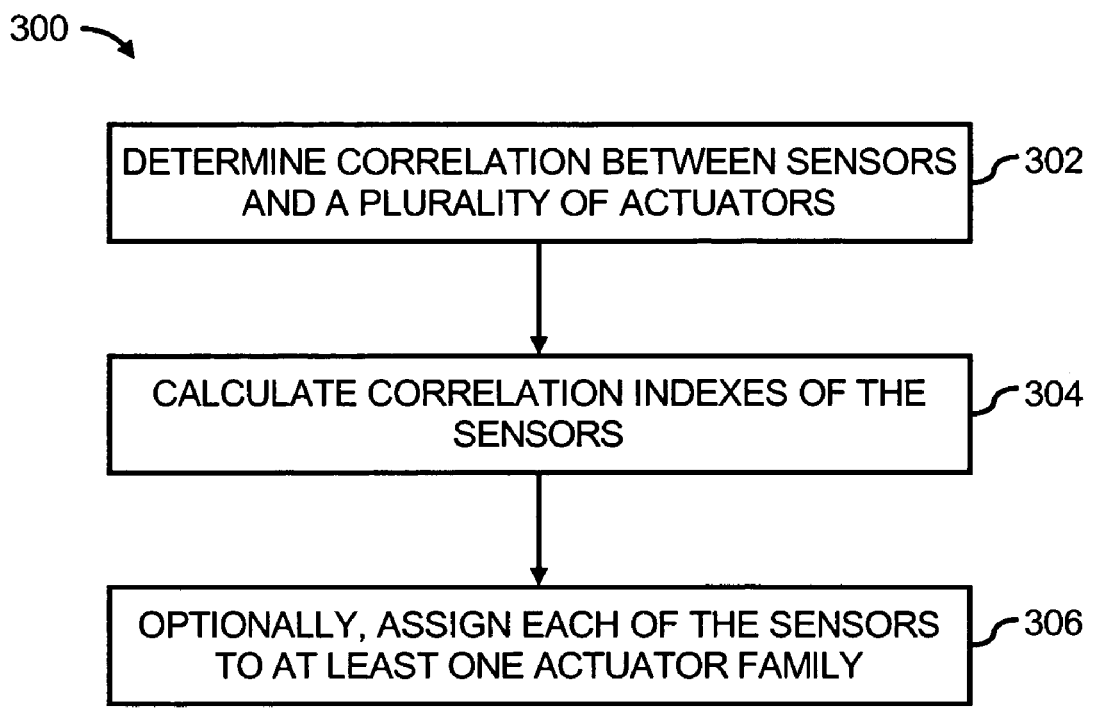
FIG. 3 illustrates a flow diagram of a method for commissioning sensors, according to an embodiment of the invention.

FIG. 3 illustrates a flow diagram of a method 300 for commissioning sensors 120a-120n, according to an example. It should be apparent to those of ordinary skill in the art that the method 300 represents a generalized illustration and that other steps may be added or existing steps may be removed, modified or rearranged without departing from a scope of the method 300.

The description of the method 300 is made with reference to the block diagram 200 illustrated in FIG. 2, and thus makes reference to the elements cited therein. It should, however, be understood that the method 300 is not limited to the elements set forth in the block diagram 200. Instead, it should be understood that the method 300 may be practiced by a system having a different configuration than that set forth in the block diagram 200.

The method 300 may be implemented to commission the sensors 120a-120n with respect to a plurality of actuators, for instance, the fluid moving devices 114a-114n. More particularly, the method 300 may be implemented to determine correlations between the sensors 120a-120n and the fluid moving devices 114a-114n, these correlations are defined as thermal correlation indexes (TCI's) as described in greater detail herein below.

Figure 4A:
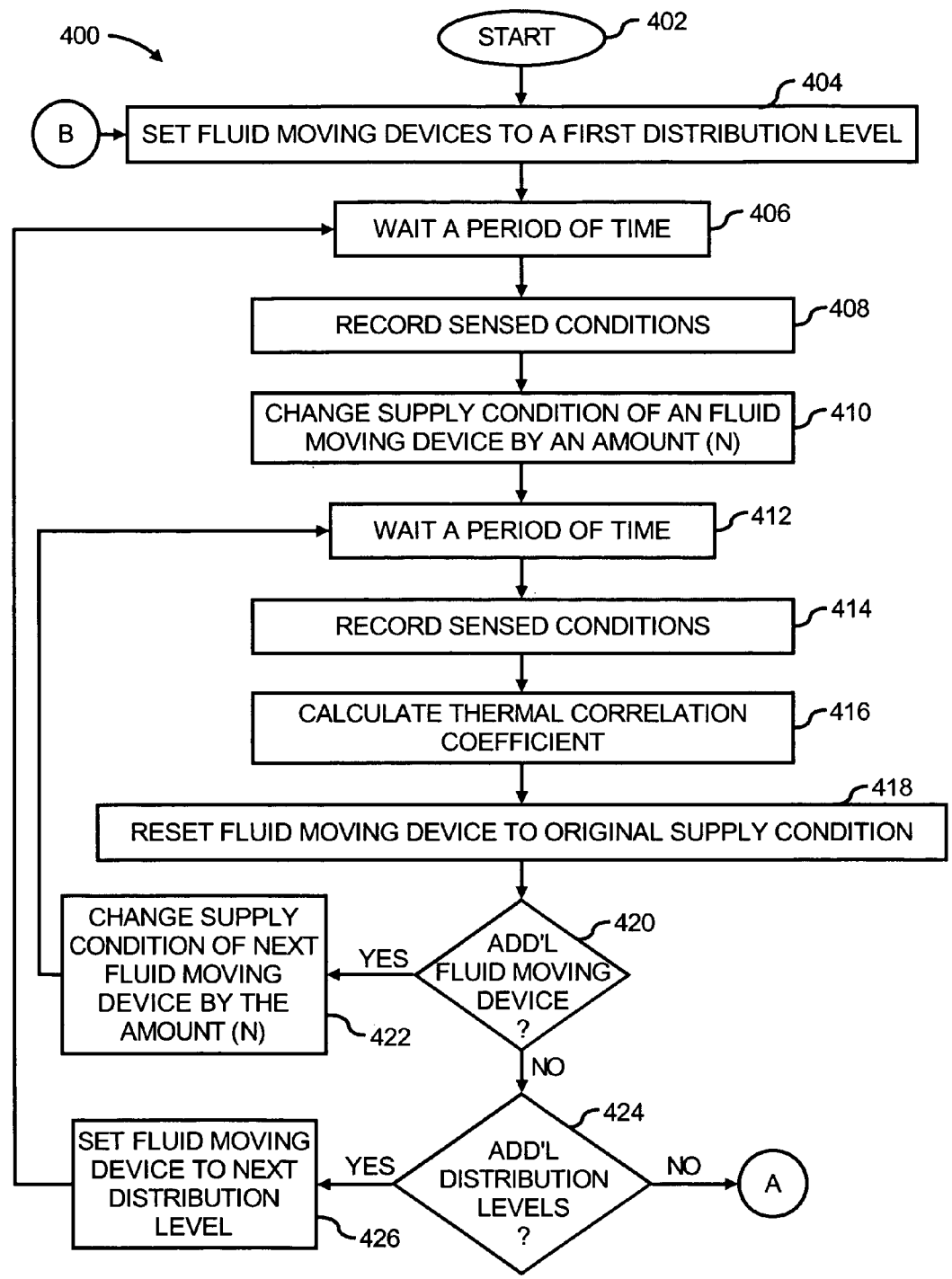
FIG. 4A illustrates a flow diagram of a method for commissioning temperature sensors, according to an embodiment of the invention.

In the method 300, the controller 130 may determine correlations between the sensors 120a-120n and a plurality of fluid moving devices 114a-114n at step 302. Manners in which these correlations may be determined are described in greater detail herein below with respect to the method 400 (FIG. 4A). The controller 130 may also calculate thermal correlation indexes (TCI's) of the sensors 120a-120n, which are functions of the plurality of fluid moving device 114a-114n settings and a particular fluid moving device, from the correlations calculated at step 304. Examples of how the thermal correlation indexes (TCI's) of the sensors 120a-120n may be calculated are described in greater detail herein below with respect to the methods 450 (FIG. 4B) and 470 (FIG. 4C). The controller 130 may optionally assign each of the sensors 120a-120n to at least one fluid moving device 114a-114n family at step 306. Various manners in which the controller 130 may assign the sensors 120a-120n to the fluid moving device 114a-114n families at step 306 are described in co-pending and commonly assigned U.S. patent application Ser. No. 11/078,087, filed on Mar. 11, 2005, the disclosure of which is hereby incorporated by reference in its entirety.

With particular reference now to FIG. 4A, there is shown a flow diagram of a method 400 for commissioning sensors, according to an example. It should be understood that the following description of the method 400 represents a generalized illustration and that other steps may be added or existing steps may be removed, modified or rearranged without departing from a scope of the method 400.

The method 400 may be initiated at step 402 in response to any of a number of stimuli or conditions. For instance, the method 400 may be initiated with activation of the components in the data center 100, such as, the fluid moving devices 114a-114n. In addition, or alternatively, the method 400 may be manually initiated or the controller 130 may be programmed to initiate the method 400 at various times, for a set duration of time, substantially continuously, etc.

Once initiated, the fluid moving devices 114a-114n are set to a first distribution level at step 404. In instances where the controller 130 is configured to control the fluid moving devices 114a-114n, the controller 130 may set the fluid moving devices 114a-114n to the first distribution level. In other instances, where the controller 130 does not control the fluid moving devices 114a-114n, they may be set manually to the first distribution level. In any regard, the first distribution level may comprise a first flow rate (VFD setting) and temperature of the fluid flow supplied by the fluid moving devices 114a-114n, which are common for the fluid moving devices 114a-114n.

The controller 130 may wait for a period of time, as indicated at step 406, prior to recording condition measurements, such as, temperature, pressure, fluid flow volume, humidity, etc., received from the sensors 120a-120n, at step 408. The controller 130 may allow this time period to elapse in order to enable a relatively steady-state of operation to be reached. The time period may be based upon, for instance, the loading on the fluid moving devices 114a-114n. In addition, during the time period at step 406, the controller 130 may determine a median condition reading for one or more of the sensors 120a-120n in the event that the conditions detected by one or more of the sensors 120a-120n oscillate during the time period. In this case, the condition measurements recorded at step 408 may comprise time-averaged values.

Following elapse of the time period at step 406, the controller 130 may record the condition measurements obtained by the sensors 120a-120n, as indicated at step 408. As stated above, the condition information may be stored through implementation of the data storage module 216. The controller 130 may instruct a fluid moving device 114a to change the condition (temperature and/or flow rate) of the fluid flow by an amount (N) at step 410. Alternatively, however, the condition of the fluid flow supplied by the fluid moving device 114a may be changed manually. In any regard, the amount (N) may comprise an amount that differs from the first distribution level by a relatively discernable amount. Thus, for instance, if the condition is temperature, the amount (N°) may range from, for instance, ±1° C. to ±20° C. or more. The temperature of the fluid flow may be changed by the amount (N°) through, for instance, varying operations of the actuator B 226, which may comprise a compressor, a chiller, a valve, etc. In addition, or alternatively, the if the condition is flow rate, the amount (N) may range from, for instance, ±1 CFM to ±50 or more. The flow rate may be changed through, for instance, varying operations of the actuator A 224, which may comprise a variable frequency drive (VFD), a fan, a blower, etc.

The controller 130 may again wait for a period of time, as indicated at step 412, prior to recording condition information received from the sensors 120a-120n at step 414. The controller 130 may allow this time period to elapse in order to enable a relatively steady-state of operation to be reached following the supply fluid condition change in the fluid moving device 114a. Following elapse of the time period at step 412, the controller 130 may again record the condition measurements obtained by the sensors 120a-120n, as indicated at step 414. In addition, during the time period at step 412, the controller 130 may determine a median condition reading for one or more of the sensors 120a-120n in the event that the conditions detected by one or more of the sensors 120a-120n oscillate during the time period. In this case, the condition measurements recorded at step 412 may comprise time-averaged values.

At step 416, the controller 130 may invoke the correlation determination module 216 to calculate a thermal correlation coefficient (TCI) for the sensors 120a-120n. The TCI is a function of the relative level of influence the fluid moving devices 114a-114n have over the sensors 120a-120n. Thus, for instance, the higher the TCI value of a sensor 120a for a fluid moving device 114a, the greater the influence the fluid moving device 114a has over that sensor 120a.

Although the TCI's may be determined through any number of suitable correlation algorithms, the following algorithm may be employed to calculate the TCI's of the sensors 120a-120n (i).

$$TCI_i = \frac{(T_1 - T_2)}{N}. \qquad \text{Equation (1)}$$

In Equation (1), $T_1$ is the temperature measurement recorded at step 408 and $T_2$ is the temperature measurement recorded at step 414. In addition, N is the amount of supply fluid condition change for the fluid moving device 114a at step 410.

By way of example, if the temperature of the sensor 120a recorded at step 408 ($T_1$) is 20° C., the temperature of the sensor 120a recorded at step 414 (T$_2$) is 25° C., and the change in temperature of the supply fluid (N) is +10° C., the TCI$_i$ between the sensor 120a (i) and the fluid moving device 114a is 0.5. As another example, if the temperature of the sensor 120b recorded at step 408 (T$_1$) is 20° C., the temperature of the sensor 120b recorded at step 414 (T$_2$) is 21° C., and the change in temperature of the supply fluid (N) is +10° C., the TCI$_i$ between the sensor 120b and the CRAC unit 114a is 0.10. As such, the sensor 120a has a greater TCI to the fluid moving device 114a than the sensor 120b. Thus, changes to the supplied fluid flow from the fluid moving device 114a are likely to have a greater impact on conditions at the sensor 120a as compared with the sensor 120b.

At step 418, the fluid moving device 114a may be reset to the temperature and supply flow rate at the first distribution level set discussed above at step 404. In addition, it may be determined whether correlations between other fluid moving devices 114b-114n and the sensors 120a-120b are to be made at step 420. If it is determined that additional correlations are to be determined, a condition of the fluid flow supplied by a next fluid moving device 114b may be varied by the amount (N) at step 422. The condition of the fluid flow supplied by the fluid moving device 114b may be varied in manners as described herein above with respect to step 410.

Following step 422, the controller 130 may again wait for a period of time at step 412, prior to recording condition information received from the sensors 120a-120n at step 414, as described above. In addition, the controller 130 may calculate TCI's for the sensors 120a-120n (i) and the fluid moving device 114b at step 416, as also described above. Moreover, the fluid moving device 114b may be reset to the first distribution level set at step 404.

Steps 412-422 may be repeated for the remaining fluid moving devices 114c-114n. In this regard, the TCI's between all of the fluid moving devices 114a-114n and the sensors 120a-120n may be determined and recorded. Although the method 400 may end following step 420, further refinements to the TCI's may be determined as discussed below.

For instance, if there are no further fluid moving devices 114a-114n for which TCI's are to be determined, it may be determined as to whether TCI's are to be determined at an additional distribution level at step 424. If "yes", the fluid moving devices 114a-114n may be set to a next distribution level at step 426. The next distribution level may comprise characteristics that differ from the first distribution level. As such, either or both of the flow rate and the temperature of the cooled fluid flow supplied by the fluid moving devices 114a-114n may differ from their settings in the first distribution level.

As shown, following step 426, steps 406-424 may be repeated to calculate and record the TCI's between the sensors 120a-120n and the fluid moving devices 114a-114n at the next distribution level. In addition, step 426, and steps 406-424, may be repeated for a number of different distribution levels. For instance, these steps may be repeated for a predetermined number of iterations, where the predetermined number of iterations may be chosen according to the desired size of the sensor-to-fluid moving device correlations. In addition, or alternatively, these steps may be repeated for a predetermined period of time. In any regard, once the correlation data has been recorded and no further data is to be collected at different distribution levels, the method 400 may end.

However, the collected data may also be processed in either of two examples, as indicated by the identifier "A". The two examples provided with respect to the following methods 450 and 470 may be implemented to estimate TCI's relating to fluid moving device 114a-114n settings that were not directly calculated through implementation of the method 400. It should, however, be understood that the TCI's calculated through implementation of the method 400 may be used to sufficiently establish correlations between the sensors 120 and the fluid moving devices 114a-114n. As such, in many instances, the following methods 450 and 470 are to be considered as being optional.

The first example is illustrated in the flow diagram of a method 450 illustrated in FIG. 4B. As shown in FIG. 4B, following a "no" condition at step 424, the correlation data collected at step 416 for the various distribution levels and fluid moving device 114a-114n settings are fed into a neural network teaching algorithm, as indicated at step 452. The neural network teaching algorithm may, for instance, comprise the correlation determination module 214 depicted in FIG. 2. In addition, the TCI's may be used to teach the neural network of the initial relationships between the fluid moving device 114a-114n settings and the conditions detected by the sensors 120a-120n. The neural network may use the initial relationships to estimate TCI's relating to various fluid moving device 114a-114n settings as described in greater detail herein below.

Figure 5:
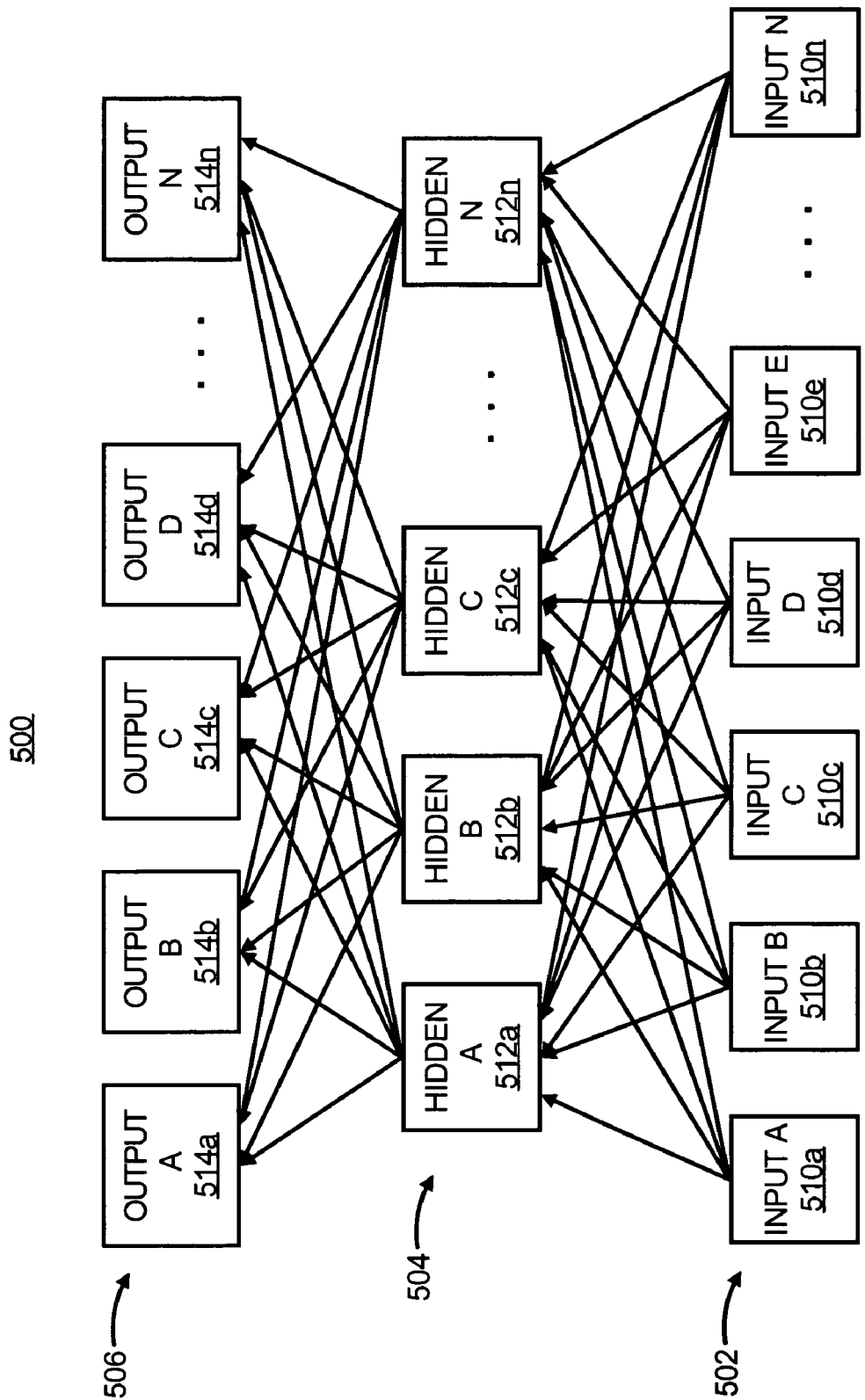
FIG. 5 shows a example of a neural network created through implementation of the method depicted in FIG. 4B, according to an embodiment of the invention.

The neural network teaching algorithm may be implemented to generate a neural network as indicated at step 454. A diagram of a neural network 500 generated at step 454, according to an example, is also illustrated in FIG. 5. As shown in FIG. 5, the neural network 500 includes an input layer 502, a hidden layer 504, and an output layer 506. The input layer 502 includes input neurons A-N 510a-510n, the hidden layer 504 includes hidden neurons A-N 512a-512n, and the output layer 506 includes output neurons A-N 514a-514n, where "n" is an integer greater than one. The ellipses " . . . " positioned between various neurons in the neural network 500 generally indicate that the neural network 500 may include any reasonably suitable number of additional neurons.

The input neurons 510a-510n may represent fluid moving device 114a-114n setpoints of the neural network 500, and may comprise, for instance, volume flow rates of the fluid flow supplied by the fluid moving devices 114a-114n (VFD speeds), fluid moving device 114a-114n supply temperatures, etc. The output neurons 514a-514n may comprise TCI's of the sensors 120a-120n. The TCI's may be fed into the neural network teaching algorithm to teach the neural network 500 of the initial relationships between the fluid moving device 114a-114n setpoints and the TCI's the sensors 120a-120n. In this regard, the output neurons 514a-514n may comprise the TCI's determined at step 416, which the teaching algorithm may implement to generate the neural network 500.

In addition, based upon the initial relationships between the fluid moving device (j) setpoints ($X_j$) and the correlation indexes ($Y_i$) for the sensors (i), the neural network 500 may determine weights ($W_{ij}$) between the fluid moving device (i) setpoints ($X_j$) and the correlation indexes ($Y_i$). The weights, which are assigned to each interaction, may be randomly selected and modified to reduce the mean square error as the learning epoch proceeds. In addition, the relationships between various fluid moving device (j) setpoints ($X_i$) and correlation coefficients ($Y_j$) for the sensors (i) may be defined by the following equation:

$$Y_i = \text{Sum}(W_{ij} * X_j + B_i), \text{ for all the fluid moving devices (j)}. \quad \text{Equation (2):}$$

In Equation (2), $B_i$ are offsets of the correlation coefficients ($Y_i$). Equation (2) may be employed in the neural network 500 to determine the correlation coefficients ($Y_l$) that correspond to various fluid moving device (j) setpoints, which were not fed into the neural network 500 at step 452.

In addition, the number of neurons 510a-510n, 512a-512n, and 514a-514n per layer 502-506 may be modified to increase the accuracy of the neural network model depicted in FIG. 5. By way of example, the number of hidden neurons 512a-512n may be increased to thereby increase the complexity in the relationship between the input neurons 510a-510n and the output neurons 514a-514n. The final model may comprise layers 502-506 of neurons 510a-510n, 512a-512n, and 514a-514n with weights and connections with associated biases that link up the input neurons 510a-510n to the output neurons 514a-514n. In one respect, therefore, the neural network 500 may be employed to determine the TCI's of the sensors 120a-120n that were not determined through implementation of the method 400. In this regard, for instance, the neural network 500 may be capable of interpolating TCI's for various fluid moving device 114a-114n setpoints.

Referring back to FIG. 4B, at step 456, the TCI's of the sensors 120a-120n may be determined from the neural network 500 generated at step 454. In addition, the sensors 120a-120n may be assigned to one or more fluid moving device families 132a-132n as described in the Ser. No. 11/078,087 application for patent.

Following step 456, it may be determined as to whether the methods 400 and 450 are to continue at step 458. The determination of whether to continue the operation modes 400 and 450 may be based upon whether it is desired to, for instance, commission the sensors 120a-120n on an ongoing basis. Thus, for instance, the methods 400 and 450 may be continued at step 458 to substantially continuously update the TCI's. If a "yes" condition is reached at step 458, the methods 400 and 450 may be repeated beginning at step 404. If, however, a "no" condition is reached at step 458, the methods 400 and 450 may end as indicated at step 460.

The second example is illustrated in the flow diagram of a method 470 illustrated in FIG. 4C. As shown in FIG. 4C, following a "no" condition at step 424, the correlation data collected at step 416 for the various distribution levels and fluid moving device 114a-114n settings are fed into a curve fitting algorithm, as indicated at step 472. The curve fitting algorithm may, for instance, comprise the correlation determination module 216 depicted in FIG. 2. In addition, the curve fitting algorithm may comprise any reasonably suitable, traditional curve fitting algorithm used to fit a multi-variant, polynomial function to the data set that defines the TCI.

The curve fitting algorithm may be implemented to determine the TCI's for the sensors 120a-120n at step 474. Although a number of various equations may be employed, an example of a polynomial function for two fluid moving devices 114a and 114b may be represented as follows:

$$TCI_{i,j,k} = \sum_{m=0}^{M} \sum_{n=0}^{M} a_l VFD_m VFD_n, \quad \text{Equation (3)}$$

where i is the sensor 120a-120n number, j is the fluid moving device 114a-114n distribution set, k is the fluid moving device 114a-114n number, and a, is a coefficient. The summation in Equation (4) may be expanded to determine the $TCI_{i,j,k}$ with additional fluid moving devices 114a-114n. In any regard, the data from the fluid moving device 114a-114n distribution set (j) may be used to define the coefficients $a_l$ of Equation (3). Although not shown, a filtering process may be performed following step 416 to reduce the number of fluid moving devices 114a-114n to consider for various sensors 120a-120n. More particularly, for instance, those fluid moving devices 114a-114n having a relatively limited effect on a sensor 120a may be removed from the calculation of the coefficients (a).

In addition, an equation representing the multi-variant, polynomial function may be implemented for each of the sensors 120a-120n. Moreover, the equation may be used to calculate the coefficients (a) for each of the sensors 120a-120n. A standard statistical regression method, for instance, through software such as, MATLAB, MICROSOFT EXCEL, MATHEMATICA, and the like, may be employed to calculate the coefficients (a), with the remaining inputs of the equation having been determined through implementation of the method 400.

Again, the sensors 120a-120n may be assigned to one or more fluid moving device families 132a-132n as described in the Ser. No. 11/078,087 application for patent. Following step 474, it may be determined as to whether the methods 400 and 470 are to continue at step 476. The determination of whether to continue the operation modes 400 and 470 may be based upon whether it is desired to, for instance, commission the sensors 120a-120n on an ongoing basis. Thus, for instance, the methods 400 and 470 may be continued at step 476 to substantially continuously update the TCI's. If a "yes" condition is reached at step 476, the methods 400 and 470 may be repeated beginning at step 404. If, however, a "no" condition is reached at step 476, the methods 400 and 470 may end as indicated at step 478.

As stated above, the method 400 is but one manner of a variety of different manners in which the sensors 120a-120n may be commissioned. For instance, the sensors 120a-120n may be commissioned based upon detected temperatures, relative pressures, fluid flow volume rates, or humidity levels as described in the commonly assigned and copending Ser. No. 11/078,087 application for patent, the disclosure of which is hereby incorporated by reference in its entirety.

Figure 6:
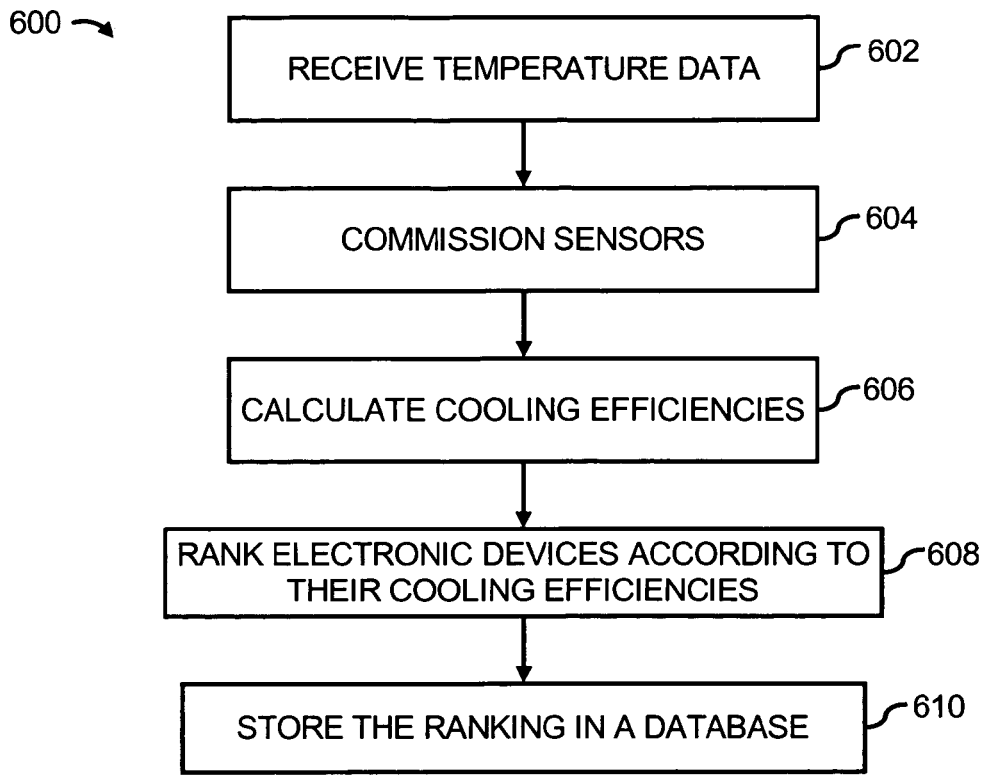
FIG. 6 illustrates a flow diagram of a method for assessing a plurality of electronic devices, according to an embodiment of the invention.

With reference now to FIG. 6, there is shown a method for assessing the plurality of electronic devices 116 according to an example. It should be understood that the following description of the method 600 represents a generalized illustration and that other steps may be added or existing steps may be removed, modified or rearranged without departing from a scope of the method 600.

The description of the method 600 is made with reference to the block diagram 200 illustrated in FIG. 2, and thus makes reference to the elements cited therein. It should, however, be understood that the method 600 is not limited to the elements set forth in the block diagram 200. Instead, it should be understood that the method 600 may be practiced by a system having a different configuration than that set forth in the block diagram 200.

The method 600 may generally be implemented to assess the electronic devices 116. More particularly, the method 600 may be implemented to assess the electronic devices 116 to determine cooling efficiencies of the electronic devices 116. In other words, the method 600 may be implemented to determine how efficient or inefficient it is to cool the electronic devices 116. As also discussed with respect to the method 600, the cooling efficiencies of the electronic devices 116 may be ranked and stored in a database, such as in the data storage module 220. In addition, the cooling efficiencies may also be considered as a local workload placement index (LWPI) because the cooling efficiencies may be used in making workload placement decisions, as described with respect to the method 700 in FIG. 7.

With respect first to FIG. 6, however, the controller 130 may receive condition data from the sensors 120a-120n, as indicated at step 602. The condition data may be received at various times and under various fluid moving device 114a-114n settings. In addition, the controller 130 may store the condition data in the data storage module 220.

At step 604, the controller 130 may commission the sensors 120a-120n as described above with respect to FIG. 3, and optionally, FIGS. 4A, and 4B. As such, for instance, the controller 130 may implement the correlation determination module 216 to determine thermal correlation indexes (TCI's) between the sensors 120a-120n and the fluid moving devices 114a-114n at step 604. The controller 130 may, moreover, determine correlations between the sensors 120a-120n and the electronic devices 116, which may have previously been stored in the data storage module 220, to also correlate the electronic devices 116 with the fluid moving devices 114a-114n.

At step 606, the controller 130 may implement the calculated TCI's to calculate the cooling efficiencies of the electronic devices 116. More particularly, for instance, the controller 130 may invoke the cooling efficiency determination module 218 to calculate the cooling efficiencies of the electronic devices 116. The controller 130 may calculate the cooling efficiencies of the electronic devices 116 through a determination of the amount of energy the fluid moving devices 114a-114n are consuming versus the amount of heat they are removing. In addition, the controller 130 may factor the cooling efficiency of the fluid moving devices 114a-114n with respect to the electronic devices 116.

More particularly, for instance, the controller 130 may calculate the cooling efficiencies of each of the electronic devices 116 based upon one or more of a thermal management margin, a fluid moving device margin, the TCI, and a recirculation level at each electronic device 116. For a given electronic device 116, the thermal management margin may be defined as the difference between a setpoint temperature ($T_{set}$), which may comprise the highest allowable temperature for that electronic device 116, and the inlet temperature ($T_{in}$) of that electronic device 116. As such, the thermal management margin may define the additional cooling margin that is available for that electronic device 116. By way of example, if a server is at 16° C., and the setpoint temperature ($T_{set}$) is 25° C., the additional cooling margin is 9° C., which is the available amount of temperature increase due to workload placement available.

In addition, the fluid moving device margin may be defined as the difference between the supply fluid temperature ($T_{sat}$) and a minimum supply fluid temperature ($T_{sat,min}$) while factoring the TCI for a particular fluid moving device 114a. In other words, the fluid moving device margin generally indicates how much the temperature of a particular fluid moving device 114a that affects a given region or a particular electronic device 116 may be reduced. For instance, if the supply fluid temperature of the fluid moving device 114a is 20° C., and the minimum supply fluid temperature of the fluid moving device 114a is 14° C., that information is combined with the TCI to determine how much of a reduction in temperature is available to any given electronic device 116 from any given fluid moving device 114a-114n. If the fluid moving device 114a is operating at a very low temperature and is thus consuming a large amount of energy, that fact is taken into consideration in determining the cooling efficiencies.

The supply fluid temperature ($T_{sat}$) and the minimum supply fluid temperature ($T_{sat,min}$) may comprise average temperatures of all of the fluid moving devices 114a-114n having a predetermined TCI level with respect to the particular electronic device 116. In addition, or alternatively, in determining the $T_{sat}$ and the $T_{sat,min}$, the controller 130 may weight the temperatures supplied by the different fluid moving devices 114a-114n differently depending upon their respective TCI levels with respect to the particular electronic device 116. Thus, for instance, the temperature of the fluid supplied by a fluid moving device 114a having a substantially higher TCI will be weighted higher than the temperature of the fluid supplied by a fluid moving device 114b having a relatively lower TCI.

The recirculation level at each electronic device 116 may generally be defined as the amount of hot fluid that is recirculated back into the electronic device 116. More particularly, for a particular electronic device 116, the recirculation level may be defined as the difference between the inlet temperature ($T_{in}$) of that electronic device 116 and the supply fluid temperature ($T_{sat}$) of at least one fluid moving device 114a determined to have a predetermined level of influence over that electronic device 116. The greater the level of hot fluid recirculation into the electronic device 116, the less efficient it is to place workload on that electronic device 116.

The cooling efficiency, which is also considered the local workload placement index (LWPI), of an electronic device 116, is calculated based upon one or more of a thermal management margin, a fluid moving device margin, the TCI, and a recirculation level of the electronic device 116. According to an example, the cooling efficiency (LWPI) is determined through a function in which the LWPI increases with an increase in one or both of the thermal management margin and the fluid moving device margin and a decrease in the recirculation level. In addition, the LWPI's for each of the plurality of electronic devices (i) may be calculated through a function of one or more of $(T_{set}-T_{in})_i$, $(T_{SAT}-T_{SAT,min})_j$, $TCI_j$, and $(T_{in}-T_{SAT})_j$.

By way of particular example and not of limitation, the cooling efficiency (LWPI) of a particular electronic device 116 (i) may be calculated from the following equation:

$$LWPI_i = \frac{(T_{set} - T_{in})_i + \left[(T_{SAT} - T_{SAT,min})_j \cdot TCI_j\right]_i}{(T_{in} - T_{SAT})_i}. \quad \text{Equation (4)}$$

Equation (4) requires that there be some level of recirculation, that is, $T_{in}$ must be higher than $T_{SAT}$, for the LWPI to be determined through implementation of Equation (4). In addition, although Equation (4) includes all of the thermal management margin, the fluid moving device margin, the TCI, and the recirculation level, it should be understood that the LWPI may be calculated with less than all of these factors.

In addition, or alternatively, one or more of the factors used to calculate LWPI may be weighted differently from the other factors in various instances. The fluid moving device margin may be weighted higher than the other factors, for instance, in situations where the controller 130 does not have control over the fluid moving devices 114a-114n, where certain of the fluid moving devices 114a-114n are more efficient than others, etc. The different weighting may also be applied, for instance, depending upon whether a more balanced load distribution or an intentionally biased loading on the electronic devices 116 is desired, based on targeting of zones in a data center that have greater levels of thermal redundancy and uptime, etc.

By way of example, in situations where the controller 130 does not have control over the fluid moving devices 114a-114n, the fluid moving device margin is more important than the thermal margin because a goal in determining the LWP-WI's is to balance the cooling workload among the fluid moving devices 114a-114n as much as reasonably possible to substantially ensure that no single fluid moving device 114a is operating at a highly inefficient level.

In any regard, the cooling efficiencies of the electronic devices 116 may be considered as local workload placement indexes (LWPI's) because the cooling efficiencies may be used to distinguish the electronic devices from each other from a workload placement standpoint. In other words, the controller 130 may select to place workloads on the electronic devices 116 having the highest cooling efficiencies (LWPI's) over electronic devices 116 having lower cooling efficiencies (LWPI's).

In any regard, the controller 130 may rank the electronic devices 116 individually or in groups, based upon their respective cooling efficiencies, as indicated at step 608. The controller 130 may, moreover, store the ranking in the data storage module 220, as indicated at step 610.

Figure 7:
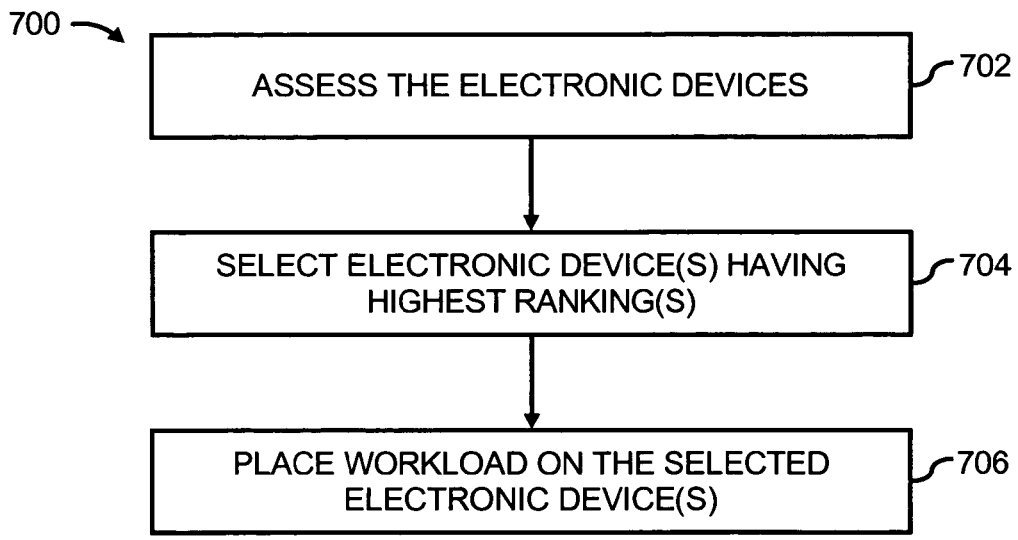
FIG. 7 illustrates a flow diagram of a method for placing workload onto at least one electronic device, according to an embodiment of the invention.

With reference now to FIG. 7, there is shown a flow diagram of a method 700 for placing workload onto at least one electronic device, according to an example. It should be understood that the following description of the method 700 represents a generalized illustration and that other steps may be added or existing steps may be removed, modified or rearranged without departing from a scope of the method 700.

At step 702, the controller 130 may assess the electronic devices 116 through, for instance, implementation of the method 600. As such, a ranking of the electronic devices 116 according to their respective cooling efficiencies (LWPI's) may be stored in a database in the data storage module 220. In addition, at step 704, the controller 130 may select the one or more electronic devices 116 having the highest ranking(s) to perform a selected workload. The controller 130 may, moreover, place the selected workload onto the selected one or more electronic devices 116, as indicated at step 706. The controller 130 may implement any reasonably suitable software or hardware to place the workload on the selected one or more of the electronic devices 116.

Although not explicitly discussed herein, the selection of the electronic devices 116 to perform a given workload may be constrained by factors in addition to their cooling efficiency rankings. These factors may include, for instance, whether the selected electronic devices 116 have appropriate configurations and components to perform the workload, whether the selected electronic devices 116 have sufficient capacities to perform the workload, whether the selected electronic devices 116 conform to service level agreements, whether the selected electronic devices 116 have been earmarked to perform other workloads, etc.

According to another example, in situations where electronic devices 116 having relatively high cooling efficiencies are unavailable to perform the workload because they are currently being used to perform another workload, the workload from the electronic device 116 having the lower cooling efficiency is moved to the electronic device 116 having the higher cooling efficiency at step 706 once the workload on that electronic device 116 has been completed. According to this example, workloads may be moved in this manner to thereby substantially optimize usage of the electronic devices 116 having the highest cooling efficiencies.

According to a further example, once the workload from the electronic device 116 having the lower cooling efficiency has been moved/migrated to the electronic device 116 having the higher cooling efficiency, the electronic device 116 is powered off in situations where that electronic device 116 is not needed to perform another workload.

The method 600 may be implemented to provide a means for determining the rankings of the electronic devices 116 in a substantially real time manner. As such, the method 600 may be performed in a relatively continuous manner to thereby continuously update the rankings. For instance, as the $T_{in}$ temperatures change, the rankings table is re-computed. Also, for instance, in the event that one or more of the fluid moving devices 114a-114n fail, the rankings may be varied to thereby substantially ensure that workloads aren't placed on electronic devices 116 that have substantially low cooling efficiencies, and are therefore inefficient to cool.

Through implementation of the method 700, therefore, workloads may be performed by those electronic devices 116 having the highest cooling efficiencies. In this regard, the amount of energy required to cool the electronic devices 116 may substantially be minimized, thereby resulting in lower data center 100 operational costs.

The operations set forth in the methods 300, 400, 450, 470, 600, and 700 may be contained as a utility, program, or subprogram, in any desired computer accessible medium. In addition, the methods 300, 400, 450, 470, 600, and 700 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices.

Exemplary computer readable storage devices include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 8:
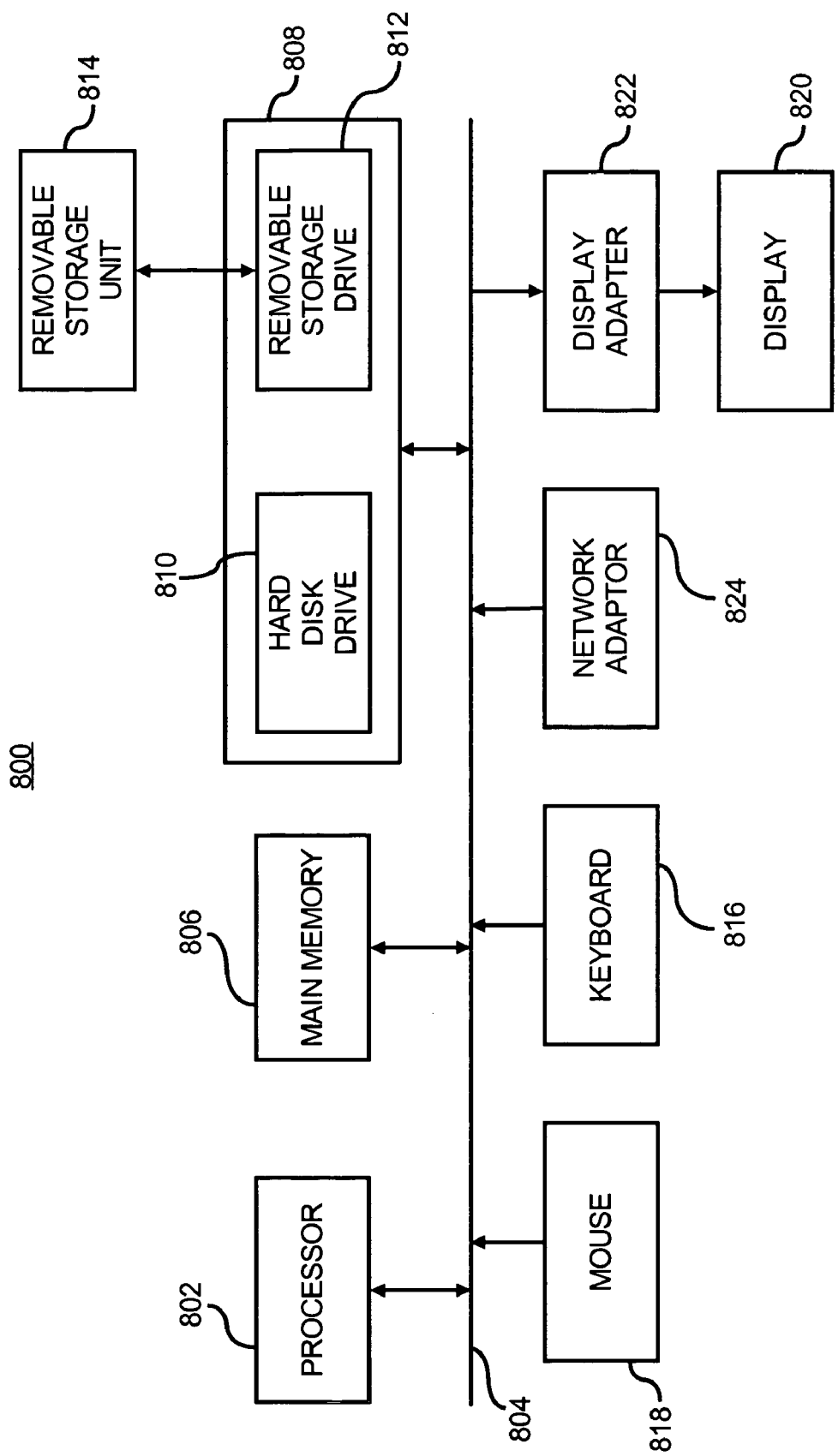
FIG. 8 illustrates a computer system, which may be employed to perform the various functions of the system for assessing electronic devices disclosed herein, according to an embodiment of the invention.

FIG. 8 illustrates a computer system 800, which may be employed to perform the various functions of the controller 130 described hereinabove, according to an embodiment. In this respect, the computer system 800 may be used as a platform for executing one or more of the functions described hereinabove with respect to the controller 130.

The computer system 800 includes one or more controllers, such as a processor 802. The processor 802 may be used to execute some or all of the steps described in the methods 300, 400, 450, 470, 600, and 700. Commands and data from the processor 802 are communicated over a communication bus 804. The computer system 800 also includes a main memory 806, such as a random access memory (RAM), where the program code for, for instance, the controller 130, may be executed during runtime, and a secondary memory 808. The secondary memory 808 includes, for example, one or more hard disk drives 810 and/or a removable storage drive 812, representing a floppy diskette drive, a magnetic tape drive, a compact disk drive, etc., where a copy of the program code for the sensor commissioning system may be stored.

The removable storage drive 810 reads from and/or writes to a removable storage unit 814 in a well-known manner. User input and output devices may include a keyboard 816, a mouse 818, and a display 820. A display adaptor 822 may interface with the communication bus 804 and the display 820 and may receive display data from the processor 802 and convert the display data into display commands for the display 820. In addition, the processor 802 may communicate over a network, for instance, the Internet, LAN, etc., through a network adaptor 824.

It will be apparent to one of ordinary skill in the art that other known electronic components may be added or substituted in the computer system 800. In addition, the computer system 800 may include a system board or blade used in a rack in a data center, a conventional "white box" server or computing device, etc. Also, one or more of the components in FIG. 8 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A method for assessing a plurality of electronic devices, wherein the plurality of electronic devices are associated with a plurality of sensors configured to detect temperature and are cooled by fluid supplied by a plurality of fluid moving devices, said method comprising:
   determining respective relationships between the plurality of fluid moving devices and the plurality of sensors, wherein the relationships signify the level of influence a particular fluid moving device has over a particular sensor;
   calculating cooling efficiencies for the plurality of electronic devices based upon the determined relationships between the plurality of fluid moving devices and the plurality of sensors, wherein the cooling efficiencies comprise measures of energy usage requirements to respectively maintain the plurality of electronic devices within predetermined temperature ranges;
   ranking the plurality of electronic devices according to their cooling efficiencies; and
   storing the plurality of electronic devices according to their rankings.

2. The method according to claim 1, said method further comprising:
   collecting temperature information from the plurality of sensors;
   populating a database with the temperature information; and
   wherein calculating the cooling efficiencies further comprises considering the temperature information from the plurality of sensors in calculating the cooling efficiencies.

3. The method according to claim 1, wherein determining the respective relationships between the plurality of sensors and the plurality of fluid moving devices further comprises determining the respective relationships by:
   sequentially perturbing the plurality of fluid moving devices;
   evaluating condition measurements of each of the plurality of sensors in response to the sequential perturbations;
   determining the respective areas of influence of the plurality of fluid moving devices based upon the evaluated condition measurements; and
   determining a thermal correlation index for each of the plurality of sensors, wherein the thermal correlation index of a particular sensor defines the level of influence a particular fluid moving device has over the particular sensor.

4. The method according to claim 3, wherein the cooling efficiencies comprise local workload placement indexes (LWPI's) for the plurality of electronic devices, the method further comprising:
   determining the LWPI's for each of the plurality of electronic devices based upon one or more of a thermal management margin, a fluid moving device margin, the thermal correlation index, and a recirculation level at each electronic device.

5. The method according to claim 4, wherein determining the LWPI's further comprises determining the LWPI's, such that the LWPI's comprise functions that increase with at least one of an increased thermal management margin, an increased fluid moving device margin, and a decreased recirculation level.

6. The method according to claim 4, further comprising:
   applying a weighting factor to at least one of the thermal management margin, the fluid moving device margin, and the recirculation level, to thereby control the relative effects each of the thermal management margin, the fluid moving device margin, and the recirculation level has on the LWPI's of the electronic devices.

7. The method according to claim 4, wherein determining the LWPI's further comprises determining the LWPI's for each of the plurality of electronic devices (i) through a function of one or more of $(Tset-Tin)i$, $(TSAT-TSAT,min)j$, $TCIij$, and $(Tin-TSAT)j$, wherein Tset denotes the highest desirable setpoint temperature for the electronic device (i), Tin denotes the inlet temperature of the electronic device (i), TSAT denotes the supply fluid temperature of a fluid moving device (j) having a predefined level of influence over the electronic device (i), TSAT, min denotes the minimum fluid flow temperature suppliable by the fluid moving device (j), and TCIij denotes the thermal correlation index between a sensor to which the electronic device (i) is associated and the fluid moving device (j).

8. The method according to claim 1, further comprising:
   selecting at least one of the plurality of electronic devices having at least one of the highest rankings to receive and perform a workload; and
   placing the workload on the selected at least one of the plurality of electronic devices.

9. The method according to claim 8, further comprising:
   tracking performance of a first workload on a first electronic device and a second workload on a second electronic device, wherein the first electronic device has a higher cooling efficiency ranking than the second electronic device; and
   in response to the first workload on the first electronic device being completed, moving the second workload from the second electronic device to the first electronic device.

10. The method according to claim 9, further comprising:
    powering down the second electronic device in response to moving the second workload to the first electronic device.

11. The method according to claim 1, further comprising:
    re-calculating cooling efficiencies for the plurality of electronic devices;
    ranking the plurality of electronic devices according to their re-calculated cooling efficiencies; and
    storing the plurality of electronic devices according to their rankings.

12. A system for assessing a plurality of electronic devices, said system comprising:
- a plurality of sensors, wherein the plurality of electronic devices are respectively associated with the plurality of sensors;
- a plurality of fluid moving devices operable to vary conditions of fluid flow supplied to the plurality of electronic devices;
- a controller configured to receive information from the plurality of sensors, wherein the controller is further configured to determine respective relationships between the plurality of fluid moving devices and the plurality of sensors, wherein the relationships signify the level of influence a particular fluid moving device has over a particular sensor, wherein the controller is further configured to determine cooling efficiencies of the plurality of electronic devices based upon the determined relationships between the plurality of fluid moving devices and the plurality of sensors, wherein the cooling efficiencies comprise measures of energy usage requirements to respectively maintain the plurality of electronic devices within predetermined temperature ranges, and wherein the controller is further configured to rank the plurality of electronic devices according to their respective cooling efficiencies.

13. The system according to claim 12, wherein the controller is further configured to place a workload on at least one of the plurality of electronic devices having at least one of the highest rankings to perform the workload.

14. The system according to claim 13, wherein the controller is further configured to track performance of a first workload on a first electronic device and a second workload on a second electronic device, wherein the first electronic device has a higher cooling efficiency ranking than the second electronic device, and wherein the controller is configured to move the second workload to the first electronic device once the first workload has been completed on the first electronic device.

15. The system according to claim 12, wherein the controller is further configured to determine the respective relationships between the plurality of electronic devices and the plurality of sensors through a commissioning process, said controller being configured to perform the commissioning process to determine a thermal correlation index for each of the plurality of sensors, wherein the thermal correlation index defines the level of influence a particular fluid moving device has over a particular sensor.

16. The system according to claim 15, wherein the controller is further configured to determine a local workload placement index (LWPI) for each of the plurality of electronic devices based upon one or more of a thermal management margin, a fluid moving device margin, the thermal correlation index, and a recirculation level at each electronic device.

17. The system according to claim 16, wherein the LWPI's comprise functions that increase with at least one of an increased thermal management margin, an increased fluid moving device margin, and a decreased recirculation level.

18. The system according to claim 16, wherein the controller is further configured to apply a weighting factor to at least one of the thermal management margin, the fluid moving device margin, and the recirculation level, to thereby control the relative effects each of the thermal management margin, the fluid moving device margin, and the recirculation level has on the LWPI's of the electronic devices.

19. A fluid moving device configured to supply cooling fluid flow to a plurality of electronic devices, said fluid moving device comprising:
- an actuator configured to manipulate temperature of the fluid flow supplied by the fluid moving device, wherein the fluid moving device is configured to supply cooled fluid flow to a plurality of locations, and wherein a plurality of sensors are configured to measure the temperature of the fluid flow supplied by the fluid moving device at the plurality of locations;
- wherein the actuator is configured to vary the fluid flow temperature a plurality of times, and during each time, the plurality of sensors are configured to detect the temperatures at the plurality of locations;
- a controller configured to correlate the one or more of the plurality of sensors to the fluid moving device by employing the plurality of actuator settings and detected temperatures, wherein the correlation signifies the level of influence a particular fluid moving device has over a particular sensor, wherein the controller is further configured to use the correlation to calculate cooling efficiencies of the plurality of electronic devices, wherein the cooling efficiencies comprise measures of energy usage requirements to respectively maintain the plurality of electronic devices within predetermined temperature ranges; and
- wherein the controller is further configured to rank the plurality of electronic devices according to their respective cooling efficiencies.

20. A computer readable storage medium on which is embedded one or more computer programs, said one or more computer programs implementing a method for placing workload on at least one electronic device of a plurality of electronic devices, wherein the plurality of electronic devices are associated with a plurality of sensors configured to detect temperature and are cooled by fluid supplied by a plurality of fluid moving devices, said one or more computer programs comprising a set of instructions for:
- determining respective relationships between the plurality of fluid moving devices and the plurality of sensors, wherein the relationships signify the level of influence a particular fluid moving device has over a particular sensor;
- calculating cooling efficiencies for the plurality of electronic devices based upon the determined relationships between the plurality of fluid moving devices and the plurality of sensors, wherein the cooling efficiencies comprise measures of energy usage requirements to respectively maintain the plurality of electronic devices within predetermined temperature ranges;
- ranking the plurality of electronic devices according to their cooling efficiencies;
- selecting at least one of the plurality of electronic devices having at least one of the highest rankings to receive and perform a workload; and
- placing the workload on the selected at least one of the plurality of electronic devices.

* * * * *